(12) United States Patent
Hsu et al.

(10) Patent No.: US 9,423,424 B2
(45) Date of Patent: Aug. 23, 2016

(54) CURRENT-DIVERTING GUIDE PLATE FOR PROBE MODULE AND PROBE MODULE USING THE SAME

(71) Applicant: MPI CORPORATION, Chu-Pei, Hsinchu Shien (TW)

(72) Inventors: Hsien-Ta Hsu, Chu-Pei (TW); Horng-Kuang Fan, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 225 days.

(21) Appl. No.: 14/152,755

(22) Filed: Jan. 10, 2014

(65) Prior Publication Data

US 2014/0197860 A1 Jul. 17, 2014

(30) Foreign Application Priority Data

Jan. 11, 2013 (TW) .............................. 102101176 A
Apr. 16, 2013 (TW) .............................. 102113494 A

(51) Int. Cl.
*G01R 31/20* (2006.01)
*G01R 1/067* (2006.01)
*G01R 1/36* (2006.01)
*G01R 1/073* (2006.01)

(52) U.S. Cl.
CPC ............. *G01R 1/36* (2013.01); *G01R 1/07357* (2013.01); *G01R 1/067* (2013.01); *G01R 1/06711* (2013.01)

(58) Field of Classification Search
CPC .... G01R 1/36; G01R 1/07357; G01R 1/067; G01R 1/06711

USPC ................. 324/755.06, 756.07, 761, 754.07
See application file for complete search history.

(56) References Cited

U.S. PATENT DOCUMENTS

| 4,622,514 | A | 11/1986 | Lewis | |
|---|---|---|---|---|
| 7,417,447 | B2 * | 8/2008 | Kister | G01R 1/07371 324/750.16 |
| 2002/0153913 | A1 * | 10/2002 | Okubo | G01R 1/06716 324/754.07 |
| 2008/0111572 | A1 | 5/2008 | Kister | |
| 2010/0244867 | A1 * | 9/2010 | Chong | G01R 3/00 324/755.05 |
| 2012/0013360 | A1 * | 1/2012 | Oh | G01R 3/00 324/763.01 |

FOREIGN PATENT DOCUMENTS

TW 201202708 1/2012
TW M428364 5/2012

* cited by examiner

*Primary Examiner* — Farhana Hoque
(74) *Attorney, Agent, or Firm* — Muncy, Geissler, Olds & Lowe, P.C.

(57) ABSTRACT

A current-diverting guide plate for use in a probe module is disclosed to include a plate body having a first surface, a second surface opposite to the first surface, and a plurality of through holes penetrating through the first and second surfaces. A conducting layer is provided at a periphery wall of each through hole of the plate body and electrically coupled to a probe slidably inserted through the through holes. A current-diverting circuit trace is disposed on the first surface of the plate body and electrically connected with the conducting layers for diverting the electric current flowing through probes. Thus, the current-diverting guide plate can be used to prevent the probes from possible damage due to an excessive instantaneous current.

7 Claims, 4 Drawing Sheets

сurrent-diverting guide plate for probe module and probe module using the same

CROSS-REFERENCE TO RELATED APPLICATIONS

This application claims priorities from Taiwan Patent Application No. 102101176 filed on Jan. 11 2013 and Taiwan Patent Application No. 102113494 filed on Apr. 16, 2013, the entire contents of which are incorporated herein by reference.

BACKGROUND OF THE INVENTION

1. Field of the Invention

The present invention relates generally to a probe module for a vertical probe card and more particularly, to a guide plate for aligning, guiding and supporting probes, which is provided with a current-diverting path to the probes, and a probe module using the guide plate.

2. Description of the Related Art

FIG. 1 schematically shows a conventional probe module 10 for use in a vertical probe card, comprising an upper guide plate 11, namely an upper die, a lower guide plate 12, namely a lower die, and a plurality of probes 13. The probes 13 each have a head 132 inserted through one of upper guide holes 112 provided at the upper guide plate 11, and a tip 134 inserted through one of lower guide holes 122 provided at the lower guide plate 12. When the tips 134 of the probes 13 contact the contact pads of the device under test (hereinafter referred to as "DUT"), a reaction force generated from the DUT is applied to the tips 134 of the probes 13 and urges the tips 134 of the probes 13 to slidably move back relative to the lower guide holes 122 to further result in deformation of the bodies 136 of the probes 13. By this mechanism, a stable contact force acting on the DUT is provided by the tips 134 of the probes 13 for allowing the test signal generated from a tester to be reliably transmitted to the DUT, and a buffering effect achieved by the deformation of the bodies 136 of the probes 13 is simultaneously provided upon probing the DUT for protecting the DUT or the probes 13.

In order to meet the product requirements of size reduction and multifunction, the pitch between two adjacent contact pads of the device under test has become smaller and smaller; under this circumstance, the probe diameter needs to be minimized for facilitating positive contact of the contact pads of the DUT having a downsized pitch. However, once the probe diameter is reduced, the probe 13, especially the buckling body 136 of the probe 13, may easily burn out due to an unexpected excessive instantaneous current running therethrough. If this happens, the damaged probe 13 has to be repaired or exchanged, causing a delay in the testing schedule.

To deserve to be mentioned, not only the probe module 10 shown in FIG. 1 but also a probe module having a guide plate for aligning, guiding and supporting the probes, such as the probe modules disclosed in U.S. Pat. No. 4,622,514 and U.S. Pat. No. 7,417,447, may have the above-mentioned problem, i.e. the slim probe tends to burn out due to instantaneous overcurrent.

SUMMARY OF THE INVENTION

It is one objective of the present invention to provide a current-diverting guide plate for a probe module, which enables an electric current flowing through probes of the probe module to be diverted effectively.

To achieve this objective of the present invention, a current-diverting guide plate comprising a plate body, a plurality of conducting layers and a current-diverting circuit trace is provided by the present invention. The plate body has a first surface, a second surface opposite to the first surface, and a plurality of through holes penetrating through the first and second surfaces for slidable insertion of probes of a probe module. Each of the conducting layers is provided at a periphery wall of one of the through holes of the plate body adapted for being electrically coupled to the probe inserting through the associated through hole. The current-diverting circuit trace is disposed on the first surface of the plate body and electrically connected with the conducting layers for diverting an electric current flowing through the probes.

Preferably, the current-diverting circuit trace has a plurality of primary branches each connected between two adjacent conducting layers for providing a primary diverting path.

Preferably, the current-diverting circuit trace further has a plurality of secondary branches each connected between the two adjacent conducting layers for providing a secondary diverting path.

Preferably, the conducting layer may be, but not limited to, a composite conducting layer composed of a metal base layer and a metal coating coated on a surface of the metal base layer and containing polymer particles for reducing friction between the through hole and the probe.

By the above-mentioned technical features of the present invention, the current-diverting guide plate of the present invention thus configured can provide a current-diverting path for the electric current flowing through the probes, thereby preventing the probes from damage caused by an excessive instantaneous current.

It is another objective of the present invention to provide a probe module, which uses the aforesaid current-diverting guide plate. The aforesaid current-diverting guide plate may be applicable to a probe module equipped with at least one guide plate that is adapted for aligning, guiding, and supporting the probes, such as, but not limited to, the probe module disclosed in this invention, U.S. Pat. No. 4,622,514 or U.S. Pat. No. 7,417,447.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
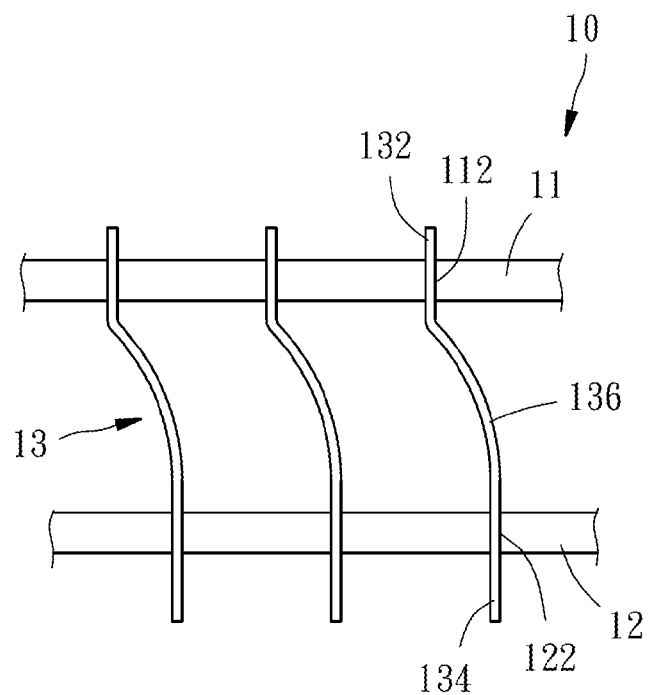
FIG. 1 is a schematic drawing of a probe module according to a prior art.
Figure 2:
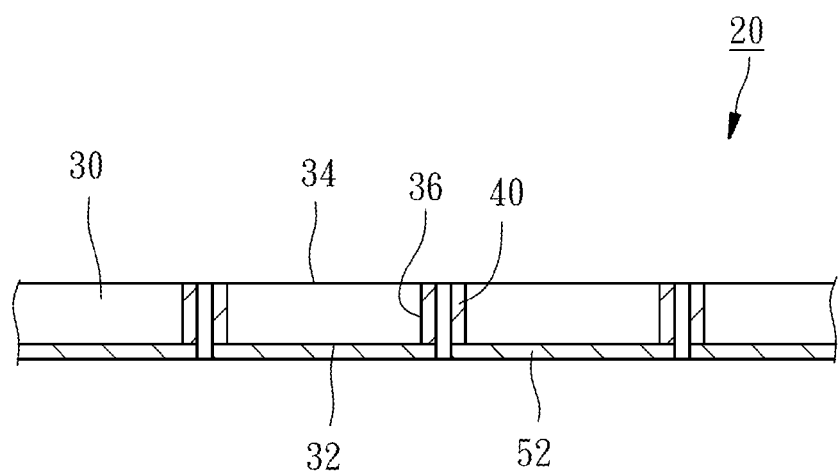
FIG. 2 is a schematic drawing of a current-diverting guide plate according to an embodiment of the present invention.
Figure 4:
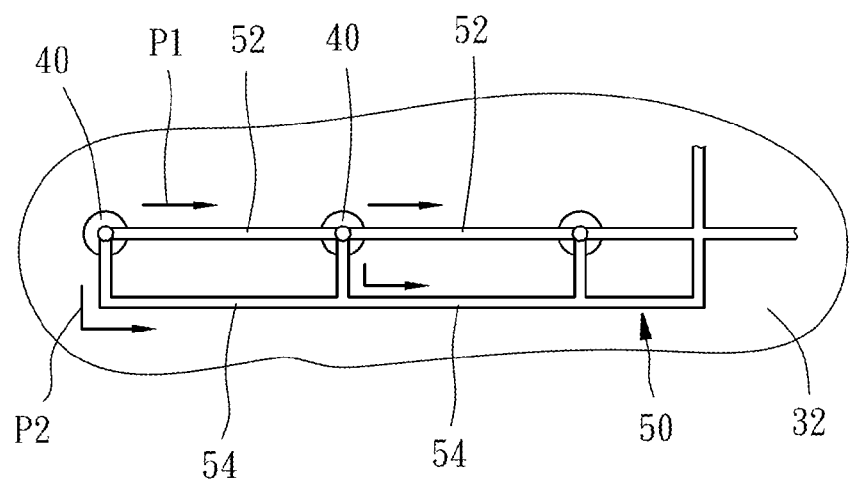
FIG. 4 is a top view of a part of the current-diverting guide plate according to the embodiment of the present invention.

As shown in FIGS. 2 and 4, a current-diverting guide plate 20 provided according to an embodiment of the present invention comprises a plate body 30, a plurality of composite conducting layers 40, and a current-diverting circuit trace 50. The structural feature of the current-diverting guide plate 20 and the relationship among the elements of the current-diverting guide plate 20 will be detailed described hereinafter.

The plate body 30 has a first surface 32, a second surface 34 opposite to the first surface 32, and a plurality of through holes 36 penetrating through the first and second surfaces 32, 34 and each having a circular or square cross-sectional shape. In this invention, the through hole 36 has a circular cross section. It is to be understood that the plate body 30 may be made from insulated materials, such as ceramic materials, semiconductor materials or conductor materials, such as silicon-based materials. If the plate body 30 is made from the semiconductor materials or the conductor materials, the surface of the plate body 30 should be treated with insulating coating.

Figure 3:
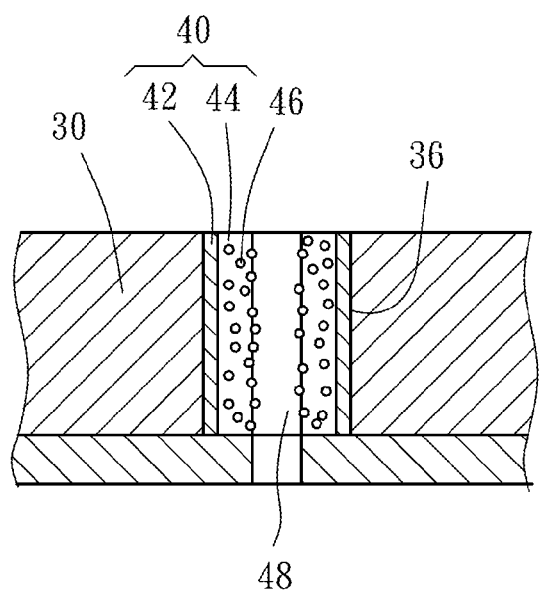
FIG. 3 is an enlarge view of a part of FIG. 2, showing the detailed structure of the conducting layer.
Figure 5:
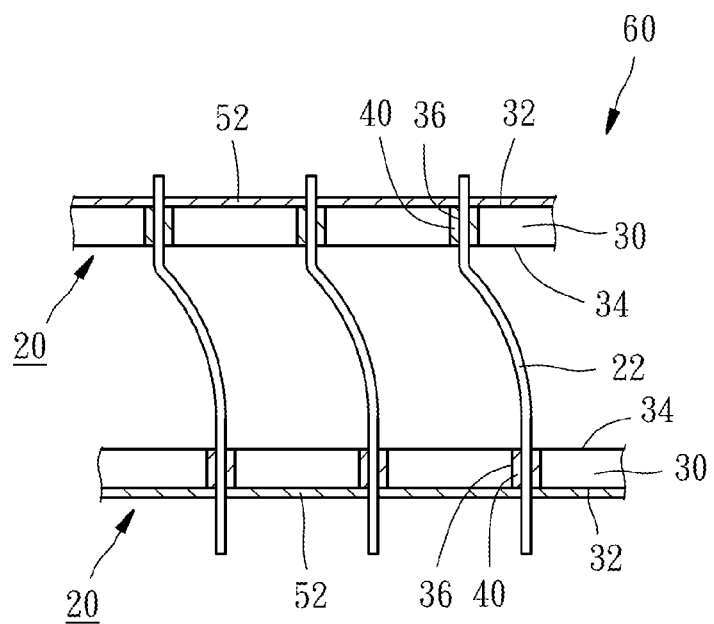
FIG. 5 is a schematic drawing of a probe module using the current-diverting guide plate according to the embodiment of the present invention.

As shown in FIGS. 3 and 5, each of the conducting layers 40 is disposed on a periphery wall of one of the through holes 36 of the plate body 30 to define a guide hole 48 for insertion of a probe 22. The conducting layers 40 each have a metal base layer 42 and a metal coating 44. Both of the metal base layer 42 and the metal coating 44 may be made of gold, cobalt, nickel, nickel alloys, or any suitable alloy. Further, the metal coating 44 is coated on the surface of the metal base layer 42 and contains evenly dispersed polymer particles 46, such as polytetrafluoroethylene particles, for providing lubrication effect and reducing coefficient of friction.

As shown in FIGS. 2 and 4, the current-diverting circuit trace 50 is disposed on the first surface 32 of the plate body 30 by a conventional process of making a printed circuit board or other suitable processes. A plurality of straight primary branches 52 and a plurality of U-shaped secondary branches 54 are provided by the current-diverting circuit trace 50. Each of the primary branches 52 is electrically connected between two adjacent conducting layers 40 for connecting the conducting layers 40 in series, such that a primary diverting path P1 is defined by the primary branches 52; and furthermore, the secondary branches 54 are set side by side and each connected between the two adjacent conducting layers 40, such that a secondary diverting path P2 is defined by the secondary branches 54.

Figure 7:
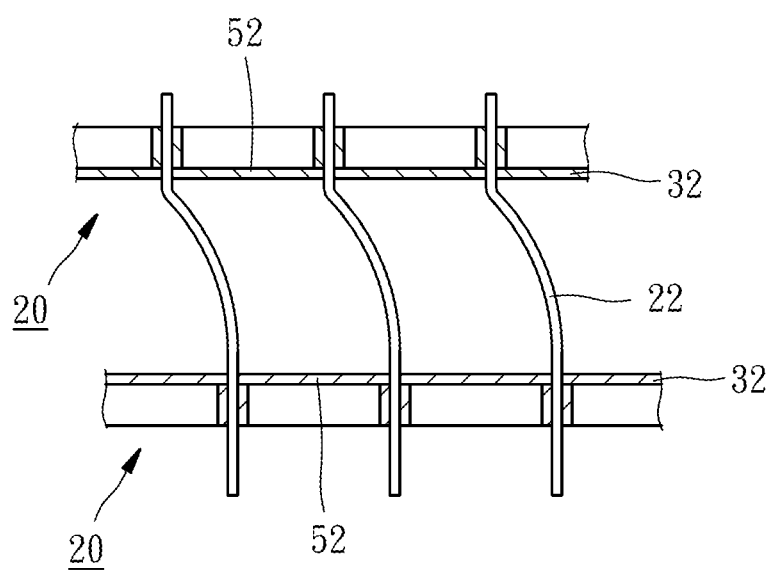
FIG. 7 is a schematic drawing of still another probe module using the current-diverting guide plate according to the embodiment of the present invention.

FIGS. 2 and 5 show a probe module 60 equipped with two current-diverting guide plates 20 of the present invention. The two current-diverting guide plates 20, namely an upper current-diverting guide plate and a lower current-diverting guide plate located below the upper current-diverting guide plate, are spacedly arranged at a distance in a manner that the second surfaces 34 of the plate bodies 30 of the upper and lower current-diverting guide plates 20 face to each other, such that the current-diverting circuit traces 50 provided on the first surfaces 32 of the plate bodies 30 are exposed outside. By this arrangement, it is convenient for an engineer to check if there is a break in the current-diverting circuit traces 50. In alternate embodiment as shown in FIG. 7, the upper and lower current-diverting guide plates 20 are spacedly arranged in a way that the two first surfaces 32 of the plate bodies 30 face to each other, such that the current-diverting circuit traces 50 provided on the first surfaces 32 of the plate bodies 30 may be well protected.

When the probe module 60 is assembled, the top and bottom ends of each of the probes 22 are inserted through the corresponding through holes 36 of the upper and lower current-diverting guide plates 20. More specifically speaking, the top and bottom ends of each probe 22 are respectively inserted through the corresponding guide holes 48 defined by the conducting layers 40 of the upper and lower current-diverting guide plates 20 and electrically coupled to the conducting layers 40. Once the probes 22 contact the contact pads of a DUT (not shown), the probes 22 will be moved slidably and smoothly in the guide holes 48 of the lower current-diverting guide plate 20 because of the low coefficient of friction provided by the composite conducting layers 40, and moreover, the probes 22 will be kept in contact with the conducting layers 40 when moved up and down in the guide holes 48. Further, as shown in FIGS. 4 and 5, when the probes 22 contact the contact pads of the DUT, the electric current passing through the probes 22 will flow from the conducting layers 40 to the current-diverting circuit traces 50 on the first surfaces 32 of the plate bodies 30, and then the electric current will be diverted by the primary diverting paths P1 defined by the primary branches 52 of the current-diverting circuit traces 50 and the secondary diverting paths P2 defined by the secondary branches 54 of the current-diverting circuit traces 50. As a result, even if an excessive instantaneous current is applied to the probes 22, the probes 22 will not easily burn out because a current-diverting mechanism is provided by the present invention, such that the probe diameter can be minimized according to actual needs for getting optimized test results.

Figure 6:
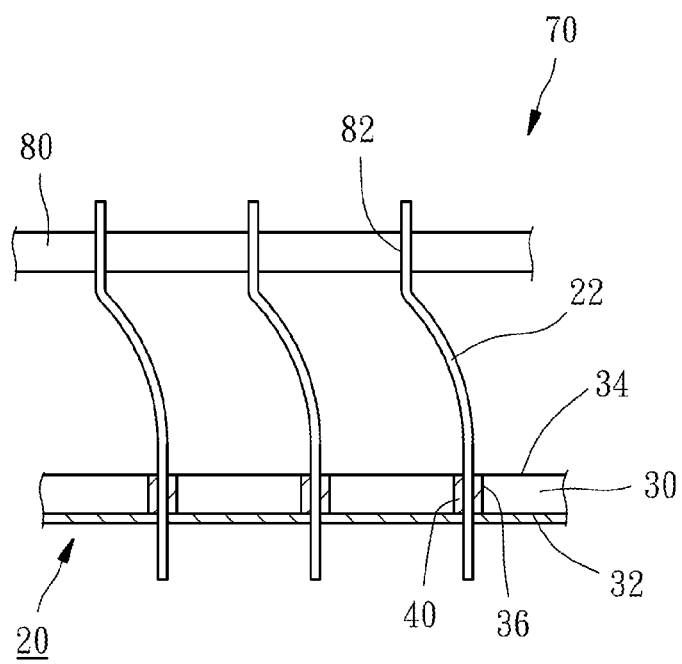
FIG. 6 is a schematic drawing of another probe module using the current-diverting guide plate according to the embodiment of the present invention.

However, it is to be mentioned that the probe module can be provided with one current-diverting guide plate 20 only. As shown in FIG. 6, a probe module 70 is configured including a current-diverting guide plate 20 and a support plate 80 spaced from the current-diverting guide plate 20 at a predetermined distance. In this embodiment, the support plate 80 provides the function of aligning, guiding, and supporting the probes 22 and is not equipped with the conducting layers 40 and the current-diverting circuit trace 50.

Further, the support plate 80 is set above the current-diverting guide plate 20 in this embodiment, but the support plate 80 may be set under the current-diverting guide plate 20 according to actual needs. In fact, as long as the support plate 80 is arranged facing the second surface 34 of the plate body 30 of the current-diverting guide plate 20, the first surface 32 of the plate body 30 of the current-diverting guide plate 20 will be exposed outside for facilitating check and maintenance of the current-diverting circuit trace 50. In another aspect, the support plate 80 may be arranged facing the first surface 32 of the plate body 30 on which the current-diverting circuit trace 50 is provided.

When the probe module 70 disclosed in FIG. 6 is assembled, the top ends of the probes 22 are inserted into guide holes 82 of the support plate 80 and the bottom ends of the probes 22 are inserted into the guide holes 48 of the current-diverting guide plate 20 and electrically coupled to the composite conducting layers 40. Thus, when the probes 22 contact the contact pads of the DUT, the electric current passing through the probes 22 can be diverted by the current-diverting circuit trace 50 of the current-diverting guide plate 20.

To deserve to be mentioned, the conducting layer 40 disclosed in this invention is not limited to a composite conducting layer made from composite materials containing the polymer particles 46. A plated through hole that is commonly used in printed circuit board can be substituted for the conducting hole structure produced by the through hole 36 and the conducting layer 40. In other words, the conducting layer 40 can be made from a single-layer conducting material that can include or exclude the polymer particles 46 as long as the single-layer conducting material is disposed on the periphery wall of one of the through holes 36 to define a guide hole for insertion of the probe 22 and being electrically connected to the current-diverting circuit trace 50. However, the composite conducting layer 40 including the polymer particles 46 is an optimum choice because of its low coefficient of friction.

On the other hand, the secondary branch 54 is configured to assist the primary branch 52 in sharing the electric current and provide a backup function. In other words, if the primary branch 52 is broken due to a manufacturing defect or long-term use, the secondary branches 54 can still ensure that the probes 22 are electrically connected with each other. However, although the secondary branches 54 can be eliminated according to actual needs, the current-diverting circuit trace 50 having the secondary branches 54 is an optimum solution that enables the probes 22 to withstand a heavy current.

It will be appreciated that the current-diverting guide plate of the present invention is basically designed for power probes, which are arranged in an electricity transmitting route of a probe card and adapted for introducing electric power into DUT when the probe card is probing the DUT. As indicated above, there is a trend that the power needed for testing DUT of new generation becomes higher and higher but the probe diameter needs to become smaller and smaller in testing task nowadays. In order to resolve the issue of probe burning, this invention uses the current-diverting guide plate 20 in cooperation with the probes 22 (power probes) to realize a current diverting path that can divert the electric current transmitted from a tester to the DUT.

Finally, it is to be further mentioned that the probe module of the present invention is adapted for being utilized in a vertical probe card, and the probes applicable in the present invention may be a vertical buckling probes or pogo pins. Since the vertical buckling probe has a buckling or curved body which is usually a weak section that tends to be firstly burned out upon receiving an instantaneous overcurrent, the current-diverting guide plate of the present invention that has the function of diverting instantaneous overcurrent to prevent the probe from burning out is especially applicable to vertical probe card adopting the buckling probes to realize maximum effectiveness.

In conclusion, the current-diverting guide plate 20 of the present invention uses the composite conducting layers 40 to reduce the friction between the guiding holes 48 and the probes 22 so as to achieve satisfied function of aligning, guiding, and supporting the probes 22. Further, the current-diverting guide plate 20 of the present invention offers two different diverting paths P1 and P2 to share the electric current, thereby preventing the probes 22 from damage due to an excessive instantaneous current.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A probe module comprising:
   an upper guide plate including a plate body that has a first surface, a second surface opposite to the first surface, and a plurality of through holes penetrating through the first and second surfaces;
   a lower guide plate spacedly disposed beneath the upper guide plate, the lower guide plate comprising:
   a plate body having a first surface, a second surface opposite to the first surface, and a plurality of through holes penetrating through the first and second surfaces; and
   a current-diverting circuit trace disposed on the first surface of the plate body of the lower guide plate; and
   a plurality of probes each slidably inserted through one of the through holes of the plate body of the upper guide plate and one of the through holes of the plate body of the lower guide plate in a way that the probes each have a probe tip disposed beneath the lower guide plate and the probes are elastically deformable between the upper and lower guide plates when the probe tips contact a device under test;
   wherein at least two of the probes are electrically connected with the current-diverting circuit trace of the lower guide plate; wherein the lower guide plate further comprises a plurality of conducting layers each provided at a periphery wall of one of the through holes of the plate body of the lower guide plate and electrically connected with the current-diverting circuit trace of the lower guide plate.

2. The probe module as claimed in claim 1, wherein the upper guide plate comprises a current-diverting circuit trace disposed on the first surface of the plate body of the upper guide plate; the upper guide plate and the lower guide plate are spacedly arranged in a manner that the two second surfaces of the plate bodies of the upper and lower guide plates face to each other; the at least two of the probes that are electrically connected with the current-diverting circuit trace of the lower guide plate are electrically connected with the current-diverting circuit trace of the upper guide plate.

3. The probe module as claimed in claim 2, wherein the upper guide plate further comprises a plurality of conducting layers each provided at a periphery wall of one of the through holes of the plate body of the upper guide plate and electrically connected with the current-diverting circuit trace of the upper guide plate.

4. The probe module as claimed in claim 1, wherein the current-diverting circuit trace of the lower guide plate comprises at least one primary branch connected between two adjacent said conducting layers.

5. The probe module as claimed in claim 4, wherein the current-diverting circuit trace of the lower guide plate comprises at least one secondary branch connected between the two adjacent conducting layers.

6. The probe module as claimed in claim 1, wherein each of the conducting layers of the lower guide plate is a composite conducting layer comprising a metal base layer and a metal coating coated on a surface of the metal base layer.

7. The probe module as claimed in claim 6, wherein the metal coating contains polymer particles.

* * * * *